(12) United States Patent
Park et al.

(10) Patent No.: US 12,260,915 B2
(45) Date of Patent: Mar. 25, 2025

(54) NON-VOLATILE MEMORY DEVICE WITH PARALLEL PROGRAMMING (71) Applicant: SK keyfoundry Inc., Cheongju-si (KR)

(72) Inventors: Seong Jun Park, Suwon-si (KR); Jong Min Cho, Yangpyeong-gun (KR); Sung Bum Park, Seongnam-si (KR); Kee Sik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 212 days.

(21) Appl. No.: 17/693,700

(22) Filed: Mar. 14, 2022

(65) Prior Publication Data

US 2023/0107619 A1 Apr. 6, 2023

(30) Foreign Application Priority Data

Oct. 6, 2021 (KR) .......................... 10-2021-0132541

(51) Int. Cl.
*G11C 16/26* (2006.01)
*G11C 16/04* (2006.01)
(Continued)

(52) U.S. Cl.
CPC ........ *G11C 16/102* (2013.01); *G11C 16/0433* (2013.01); *G11C 16/08* (2013.01);
(Continued)

(58) Field of Classification Search
CPC ... G11C 16/102; G11C 16/0433; G11C 16/08; G11C 16/26; G11C 16/30; G11C 17/16
(Continued)

(56) References Cited

U.S. PATENT DOCUMENTS 5,854,508 A * 12/1998 Kajigaya ................. H01L 24/05
257/784
6,232,154 B1 * 5/2001 Reith ...................... H01L 28/40
257/E21.651
(Continued)

FOREIGN PATENT DOCUMENTS

KR 10-2013-0090714 * 8/2013
KR 10-2013-0090714 A 8/2013
KR 10-1762919 B1 7/2017

OTHER PUBLICATIONS

Translation of the Foreign Office Action (Year: 2021).*
(Continued)

*Primary Examiner* — Alexander Sofocleous
*Assistant Examiner* — Tracy Hampton
(74) *Attorney, Agent, or Firm* — NSIP Law (57) ABSTRACT

A non-volatile memory device includes a first fuse cell array and a second fuse cell array, spaced from each other; a first ground ring region and a second ground ring region disposed to surround the first fuse cell array and the second fuse cell array, respectively; a third ground ring region configured to connect the first ground ring region and the second ground ring region; a power ring region disposed to surround the first ground ring region and the second ground ring region; and an address decoder, disposed between the first fuse cell array and the second fuse cell array, configured to supply a word line signal to each of the first fuse cell array and the second fuse cell array. The ground ring regions supply a ground voltage to each of the first fuse cell array and the second fuse cell array.

17 Claims, 9 Drawing Sheets (51) Int. Cl.
*G11C 16/08* (2006.01)
*G11C 16/10* (2006.01)
*G11C 16/30* (2006.01)
*G11C 17/16* (2006.01)

(52) U.S. Cl.
CPC .............. *G11C 16/26* (2013.01); *G11C 16/30* (2013.01); *G11C 17/16* (2013.01)

(58) Field of Classification Search
USPC ...................................................... 365/225.7
See application file for complete search history.

(56) References Cited

U.S. PATENT DOCUMENTS

| 9,082,475 B2* | 7/2015 | Kim ......................... G11C 7/22 |
| 2021/0280263 A1* | 9/2021 | Lee ......................... G11C 7/227 |

OTHER PUBLICATIONS

Korean Office Action issued on Nov. 18, 2022, in counterpart Korean Patent Application No. 10-2021-0132541 (7 pages in Korean).

* cited by examiner

NON-VOLATILE MEMORY DEVICE WITH PARALLEL PROGRAMMING

CROSS-REFERENCE TO RELATED APPLICATION

This application claims the benefit under 35 U.S.C. § 119 of Korean Patent Application No. 10-2021-0132541 filed on Oct. 6, 2021, in the Korean Intellectual Property Office, the entire disclosure of which is incorporated herein by reference for all purposes.

BACKGROUND

1. Field

The following description relates to a non-volatile memory device with parallel programming.

2. Description of Related Art

One-Time Programmable (OTP) memory is one of a non-volatile memory device. The OTP memory generally employs a fuse to be programmed by applying a high programming voltage. A serial program test is generally performed to check whether the fuse is programmed or not. The serial program test requires a long program test time, because one-by-one bit is tested. Accordingly, a test cost is increasing correspondingly with the long test time. A total test time reduction may be desired to save the test cost in the OTP memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a non-volatile memory device includes a first fuse cell array and a second fuse cell array, spaced from each other; a first ground ring region and a second ground ring region disposed to surround the first fuse cell array and the second fuse cell array, respectively; a third ground ring region configured to connect the first ground ring region and the second ground ring region; a power ring region disposed to surround the first ground ring region and the second ground ring region, be disposed between the first fuse cell array and the second fuse cell array, and supply a power voltage to the first fuse cell array and the second fuse cell array; and an address decoder, disposed between the first fuse cell array and the second fuse cell array, configured to supply a word line signal to each of the first fuse cell array and the second fuse cell array. The first ground ring region, the second ground ring region, and the third ground ring region supply a ground voltage to the first fuse cell array and the second fuse cell array.

The first fuse cell array and the second fuse cell array may be symmetrically disposed about the address decoder, and an identical number of unit cells may be disposed in the first fuse cell array and the second fuse cell array.

The non-volatile memory device may further include a first program driver logic configured to supply a program current to the first fuse cell array, a second program driver logic configured to supply the program current to the second fuse cell array, a DIN selection logic configured to selectively operate the first program driver logic and the second program driver logic, and a control logic comprising the DIN selection logic.

The first program driver logic and the second program driver logic may include a plurality of program current drivers. The first program driver logic and the second program driver logic may be configured to simultaneously select the plurality of program current drivers based on a data input selection signal generated in the DIN selection logic, and simultaneously supply the program current equally to the selected plurality of program current drivers.

The non-volatile memory device may further include a plurality of unit cells in each of the first fuse cell array and the second fuse cell array, wherein each of program current drivers comprises a PMOS transistor, and each of the unit cells comprises a first NMOS transistor and a second NMOS transistor; a fuse disposed between the first NMOS transistor and the second NMOS transistor; a first node disposed between the first NMOS transistor and the fuse; a second node disposed between the second NMOS transistor and the fuse; and a third NMOS transistor connected to the first node. The program current may flow through the PMOS transistor, the second node, the fuse, the first node and the third NMOS transistor, and program the fuse.

The non-volatile memory device may further include a first decoupling power capacitor in the ground ring region, and a second decoupling power capacitor in the power ring region. The first decoupling power capacitor and the second decoupling power capacitor may be MOS capacitors.

The power ring region may overlap the address decoder.

The non-volatile memory device may further include a first sense amplifier (AMP) and a second sense AMP configured to detect read data of a plurality of unit cells in each of the first fuse cell array and the second fuse cell array. Each of the first sense AMP and the second sense AMP may include a read current controller and a reference voltage generator configured to generate a reference voltage. Each of the first sense AMP and the second sense AMP may compare a voltage at a fuse of each of the unit cells with the reference voltage and determine whether each of the unit cells is programmed.

In another general aspect, a non-volatile memory device includes a first fuse cell array and a second fuse cell array, spaced apart from each other and disposed in symmetry, an address decoder disposed between the first fuse cell array and the second fuse cell array, a plurality of program current drivers configured to supply a program current to each of the first fuse cell array and the second fuse cell array, and a DIN selection logic configured to supply to a data input selection signal to simultaneously operate the plurality of program current drivers. The program current is simultaneously supplied equally to the plurality of program current drivers based on the data input selection signal.

The first fuse cell array and the second fuse cell array may be symmetrical about the address decoder, and an identical number of unit cells may be included in the first fuse cell array and the second fuse cell array.

The non-volatile memory device may further include a plurality of unit cells in each of the first fuse cell array and the second fuse cell array, wherein each of the program current drivers includes a PMOS transistor, and each of the unit cells includes a first NMOS transistor and a second NMOS transistor; a fuse disposed between the first NMOS transistor and the second NMOS transistor; a first node disposed between the first NMOS transistor and the fuse; a second node disposed between the second NMOS transistor and the fuse; and a third NMOS transistor connected to the first node. The program current may flow through the PMOS transistor, the second node, the fuse, the first node and the third NMOS transistor and programs the fuse.

The non-volatile memory device may further include a first ground ring region disposed to surround the first fuse cell array, a second ground ring region disposed to surround the second fuse cell array, a third ground ring region configured to connect the first ground ring region and the second ground ring region, a power ring region disposed to surround the first ground ring region and the second ground ring region, and a decoupling power capacitor in each of the ground ring region and the power ring region.

The first ground ring region, the second ground ring region, and the third ground ring region may supply a ground voltage to each of the first fuse cell array and the second fuse cell array. The power ring region may supply a power voltage to each of the first fuse cell array and the second fuse cell array.

In another general aspect, a non-volatile memory device includes an address decoder configured to connect to a power voltage and a ground voltage; fuse cell arrays, symmetrically disposed about the address decoder, configured to connect to the address decoder, wherein the address decoder supplies a word line signal to the fuse cell arrays; a control logic configured to control the address decoder; program driver logics, disposed about the control logic, configured to supply program current to the fuse cell arrays, connect to the control logic, and connect to the fuse cell arrays, respectively; and sense amplifiers (AMPs), disposed about the control logic, configured to detect whether the fuse cell arrays are programmed, connect to the control logic, and connect to the fuse cell arrays, respectively.

The non-volatile memory device may further include ground ring regions disposed to surround the fuse cell arrays, respectively, and supply the ground voltage to the fuse cell arrays; and a power ring region disposed to surround the ground ring regions and supply the power voltage.

The non-volatile memory device may further include first decoupling power capacitors in the ground ring regions, and a second decoupling power capacitor in the power ring region. The first decoupling power capacitor and the second decoupling power capacitor are MOS capacitors. The power ring region may overlap the address decoder.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure may solve problems related to the above technical issue and provide a non-volatile memory device that is able to program all bits simultaneously.

A detailed description is given below, with attached drawings.

Figure 1:
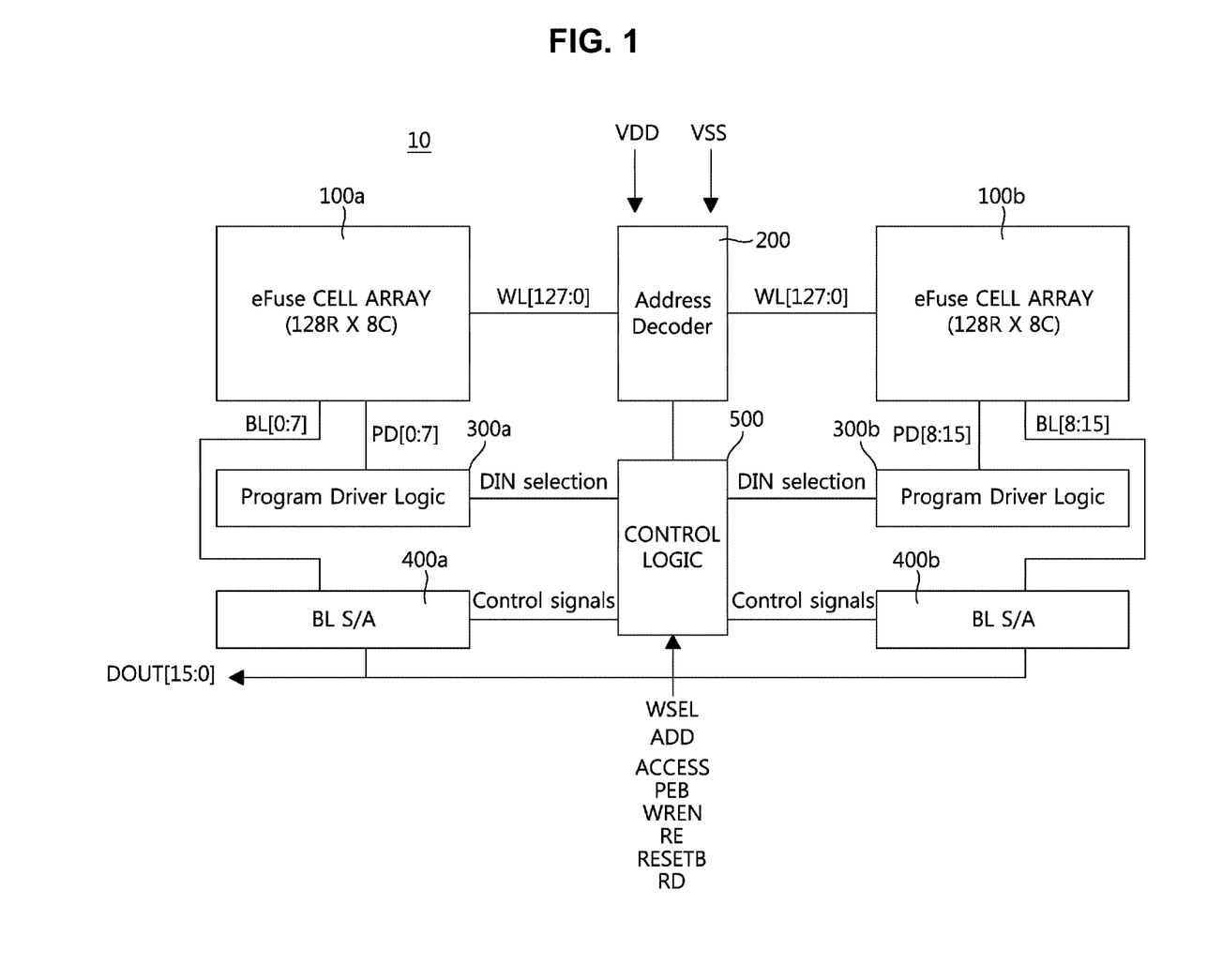
FIG. 1 illustrates a block diagram of a non-volatile memory device in accordance with one or more embodiments of the disclosure.

FIG. 1 illustrates a block diagram of a non-volatile memory device in accordance with one or more embodiments of the disclosure.

Referring to FIG. 1, a non-volatile memory device 10 may include a first fuse cell array 100a, a second fuse cell array 100b, an address decoder 200, a first program driver logic 300a, a second program driver logic 300b, a first sense AMP 400a, a second sense AMP 400b, and a control logic 500.

A memory cell array may comprise at least the first and second fuse cell arrays 100a and 100b. The first fuse cell array 100a may be spaced apart from and the second fuse cell array 100b. The address decoder 200 may be disposed between the first and second fuse cell arrays 100a and 100b. The first and second fuse cell arrays 100a and 100b may respectively comprise a plurality of unit cells. In one example, each cell array 100a and 100b may comprise 128 rows×8 columns, so each of the first and second cell arrays 100a and 100b has 1,024 unit cells. The same number of unit cells may be disposed on opposite sides, respectively. Therefore, there may be a total of 2,048 unit cells. In one example, when each cell array 100a and 100b comprises 128 row×8 columns, a non-volatile memory device 10 may include a cell array disposed with 128 rows*16 columns in total. A cell array 100 may include 128 word lines and 16 bit lines. The memory cell array may include total 2,048 bits (unit cells). The 2,048 unit cells may be equally arranged in two fuse cell arrays 100a and 100b by half. Similarly, the 16 bit lines may also be equally arranged in two fuse cell arrays 100a and 100b by half.

The address decoder 200 may activate word lines (WL) of the first and second fuse cell arrays 100a and 100b through a WL [127:0] signal. In one example, it is possible to simultaneously activate some of 128 word lines in the first fuse cell array 100a or to simultaneously activate some of 128 word lines in the second fuse cell array 100b. It is also possible to simultaneously activate all word lines. The address decoder 200 may be connected to a power voltage (VDD) terminal and a ground voltage (VSS) terminal.

A program driver logic 300 may include the first and second program driver logics 300a and 300b. The first and second program driver logics 300a and 300b may supply a program current to the first and second fuse cell arrays 100a and 100b, respectively. The first program driver logic 300a may provide PD [0:7] signal. Likewise, the second program driver logic 300b may provide PD [8:15] signal.

A sense AMP 400 may include the first and second sense AMPs 400a and 400b. The first and second sense AMPs 400a and 400b may detect read data with a read operation. The read data are output through an output terminal (DOUT). The first and second sense AMPs 400a and 400b may determine whether a selected e-fuse cell is programmed or not.

The control logic 500 may control the address decoder 200, the first and second program driver logics 300a and 300b, the first sense AMP 400a, and the second sense AMP 400b. In one example, the control logic 500 may control the program driver logics 300a and 300b through a data input (DIN) selection signal.

A non-volatile memory device 10 may be connected to several input pins such as WSEL, ADD, ACCE, PEB, WREN, RE, RESETB, RD, and DIN, etc. Descriptions for each pin are illustrated in Table 1.

TABLE 1

| Port Name | I/O Type | Description |
| --- | --- | --- |
| ADD[6:0] | Input | Address pins for word line selection |
| ACCESS | Input | For read or programming access (active high) |
| PEB | Input | Programming enable (active low) |
| RE | Input | Read enable (active high) |
| DIN[15:0] | Input | Data inputs |
| DOUT[15:0] | Output | Data outputs |
| WSEL[3:0] | Input | Programming current control (active high) |
| RD[1:0] | Input | Read margin check control (default low) |
| RESETB | Input | Power-on reset (active low) |
| WREN | Input | Write enable (active high) |
| VDD | Supply | External supply power |
| VSS | Supply | Ground |

As described, a non-volatile memory device in accordance with one or more embodiments of the disclosure may be divided into two cell arrays 100a and 100b, and two program driver logics 300a and 300b may be disposed to supply a program current respectively to two cell arrays 100a and 100b. A program current may be supplied to each unit cell through a source line (SL) based on the DIN selection signal from the control logic 500, and PD signal from the program driver logics 300a and 300b. Multiple unit cells may be simultaneously programmed.

Figure 2:
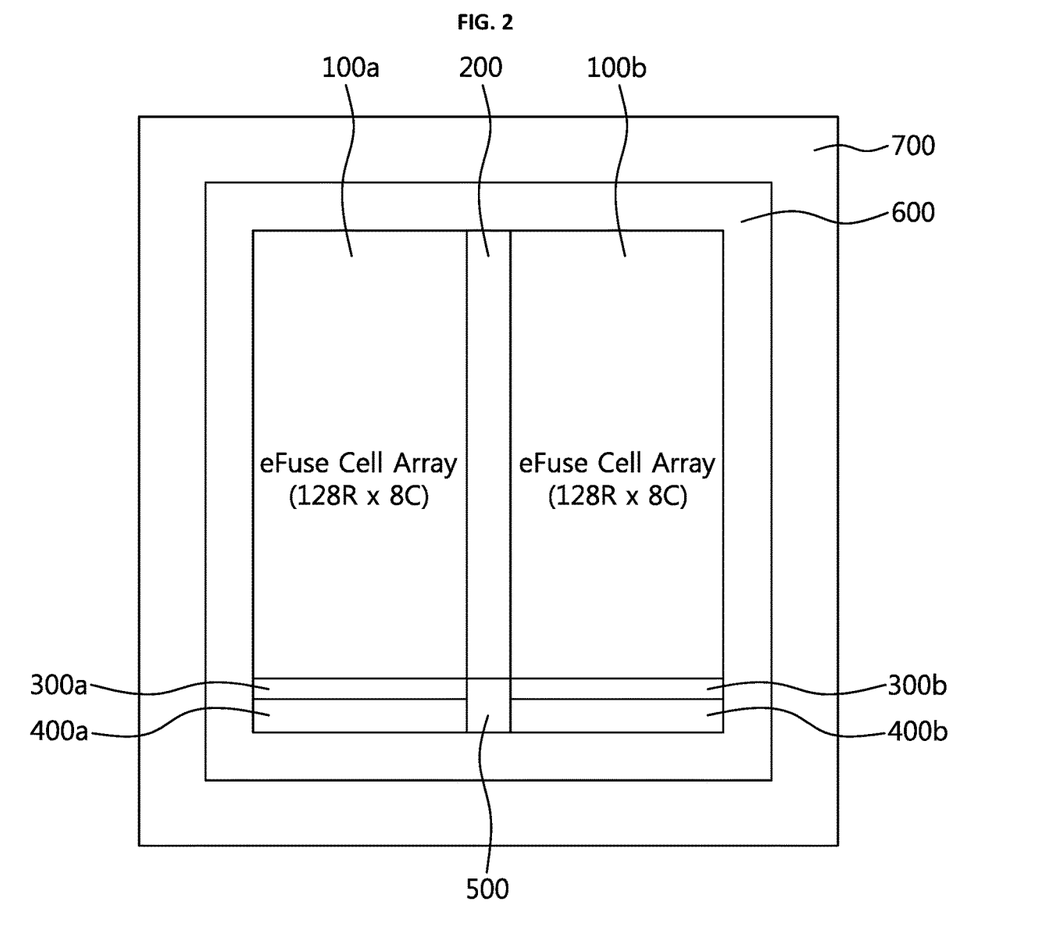
FIG. 2 illustrates a test vehicle layout of a chip, including a non-volatile memory device in accordance with one or more embodiments of the disclosure.

FIG. 2 illustrates a test vehicle layout of a chip, including a non-volatile memory device, in accordance with one or more embodiments of the disclosure.

Referring to FIG. 2, a test vehicle layout including 2 Kbits (128×16) fabricated for a parallel programming eFuse memory is suggested for self-qualification. A non-volatile memory device may include the first and second fuse cell arrays 100a and 100b. The first and second fuse cell arrays 100a and 100b may be disposed to be spaced from each other and symmetric as a whole, and they may be located in the center of a chip.

In one example, an e-fuse cell array may have a cell array disposed with 128 rows×16 columns. In an embodiment of the disclosure, it may be equally divided into two cell arrays 100a and 100b. That is, the first and second fuse cell arrays 100a and 100b may be disposed as a bilateral symmetry structure, and each cell array 100a and 100b may have a capacity with 128 rows×8 columns. The first and second fuse cell arrays 100a and 100b may respectively include 128 word lines and 8 bit lines. Compared with a typical case, the number of rows is identical, but the number of columns is reduced by half. Therefore, there may be 1,024 unit cells in each cell array 100a and 100b, and when combining the first fuse cell array 100a with the second fuse cell array 100b, total 2,048 unit cells are included, like a typical case. Since the first fuse cell array 100a has the same number of unit cells as the second fuse cell area 100b, the first fuse cell array 100a may have the same area as the second fuse cell area 100b.

The address decoder 200 may be disposed between the first and second fuse cell arrays 100a and 100b. Since the address decoder is disposed in a center between the first and second fuse cell arrays 100a and 100b, it is possible to uniformly activate a plurality of word lines disposed in each cell array 100a and 100b. On the other hand, if the address decoder 200 is disposed on a left end of the first fuse cell array 100a or on a right end of the second fuse cell array 100b, it may be difficult to uniformly activate a plurality word lines disposed in the cell array. Therefore, it may be beneficial that the address decoder 200 is arranged in a center between the first and second fuse cell arrays 100a and 100b.

The first and second program driver logics 300a and 300b may be disposed at the bottom the first and second fuse cell arrays 100a and 100b, respectively. The first and second program driver logics 300a and 300b may include a program current driver that each column has. Since there are 8 columns in each of the first and second fuse cell arrays 100a and 100b, there are 8 program current drivers, respectively. Each program current driver may control a program current to flow equally into a selected column. Therefore, a unit cell in the selected column may be equally programmed simultaneously.

The first and second sense AMPs 400a and 400b may also be disposed at the bottom of the cell arrays 100a and 100b, respectively. In an example, the first and second sense AMPs 400a and 400b may be implemented for a read operation.

The control logic 500 may be disposed at the bottom of the address decoder 200. Additionally, the control logic 500 may be disposed between the first and second program driver logics 300a and 300b. Compared with other elements discussed above, the control logic 500 may relatively have the smallest area in a chip. In an example, the control logic 500 may supply a control signal to program unit cells. The control logic 500 may control all unit cells or some of unit cells to be programmed in the first and second fuse cell arrays 100a and 100b.

A non-volatile memory device in accordance with one or more embodiment of the disclosure may include a ground ring region 600 to supply a ground voltage (VSS) and a power ring region 700 to supply a power voltage (VDD). A ground ring 600 and a power ring 700 may be disposed to surround the first and second fuse cell arrays 100a and 100b in order to uniformly supply ground voltage (VSS) and power voltage (VDD) to the first and second fuse cell arrays 100a and 100b. It is recommended that a ring-type ground region 600 and a ring-type power ring region 700 are disposed to surround the cell arrays 100a and 100b. If a pad for the power voltage (VDD) is placed on one side of the first cell array 100a rather than the second cell array 100b, resistance may be increased to supply a power to the second cell array 100b. More details for layouts of the ground ring 600 and the power ring 700 will be described in FIGS. 3 to 5.

Figure 3:
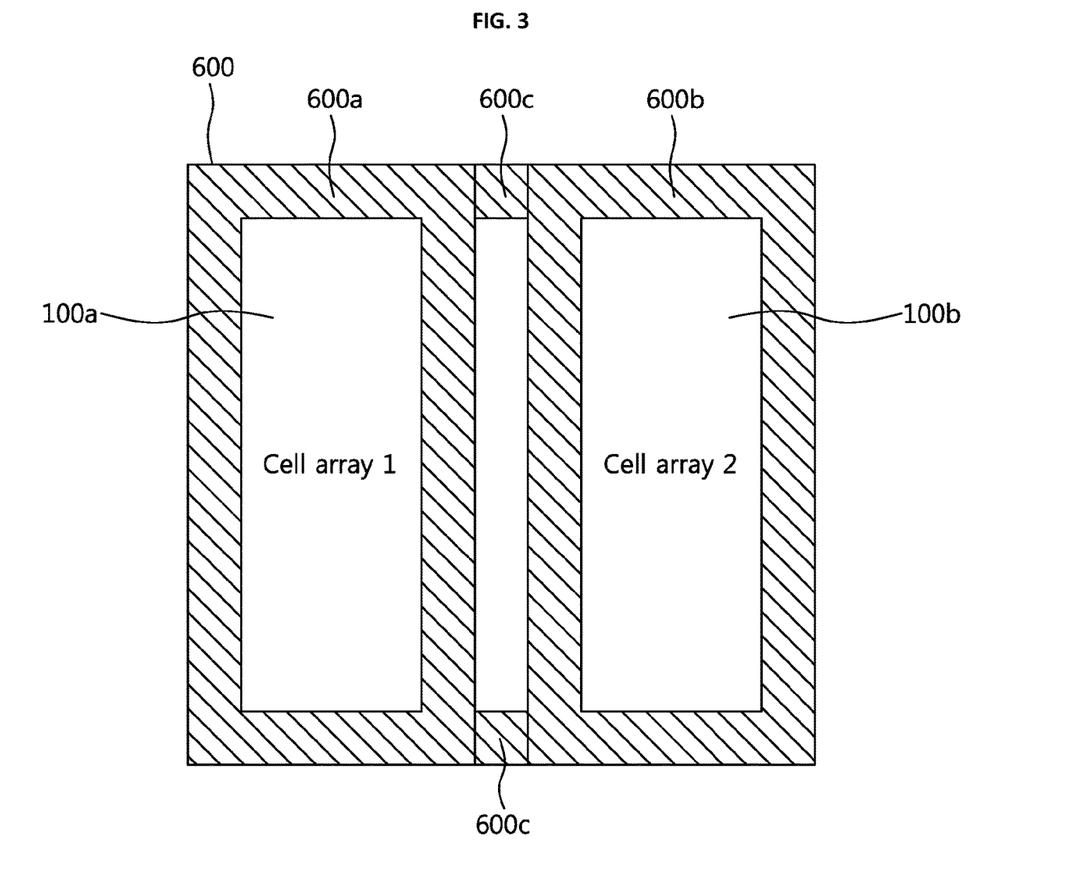
FIG. 3 illustrates a ground ring of a non-volatile memory device in accordance with one or more embodiments of the disclosure.

FIG. 3 illustrates a ground ring of a non-volatile memory device in accordance with one or more embodiments of the disclosure.

As illustrated in FIG. 3, the ground ring 600 or the ground ring region 600 may include a first ground ring region 600a, a second ground ring region 600b, and a third ground ring region 600c. The first, second and third ground ring regions 600a, 600b and 600c may be all connected electrically to each other and may receive the same ground voltage (VSS) or a ground power (VSS). A power ring (not illustrated) may be disposed between the first ground ring region 600a and the second ground ring region 600b to provide a power voltage (VDD).

The first ground ring region 600a may surround an outside of the first cell array 100a. Likewise, the second ground ring region 600b may surround an outside of the second cell array 100b. The third ground ring region 600c may be disposed to electrically connect the first ground ring region 600a with the second ground ring region 600b. The third ground ring region 600c may be considered a ground ring connection region. The third ground ring region 600c may be disposed on a corner side where the first and second fuse cell arrays 100a and 100b face each other.

Therefore, each of the first and second fuse cell arrays 100a and 100b may be completely surrounded by the first ground ring region 600a and the second ground ring region 600b, respectively. The ground ring 600 may be disposed as described above to uniformly supply ground power to the first and second fuse cell arrays 100a and 100b.

Figure 4:
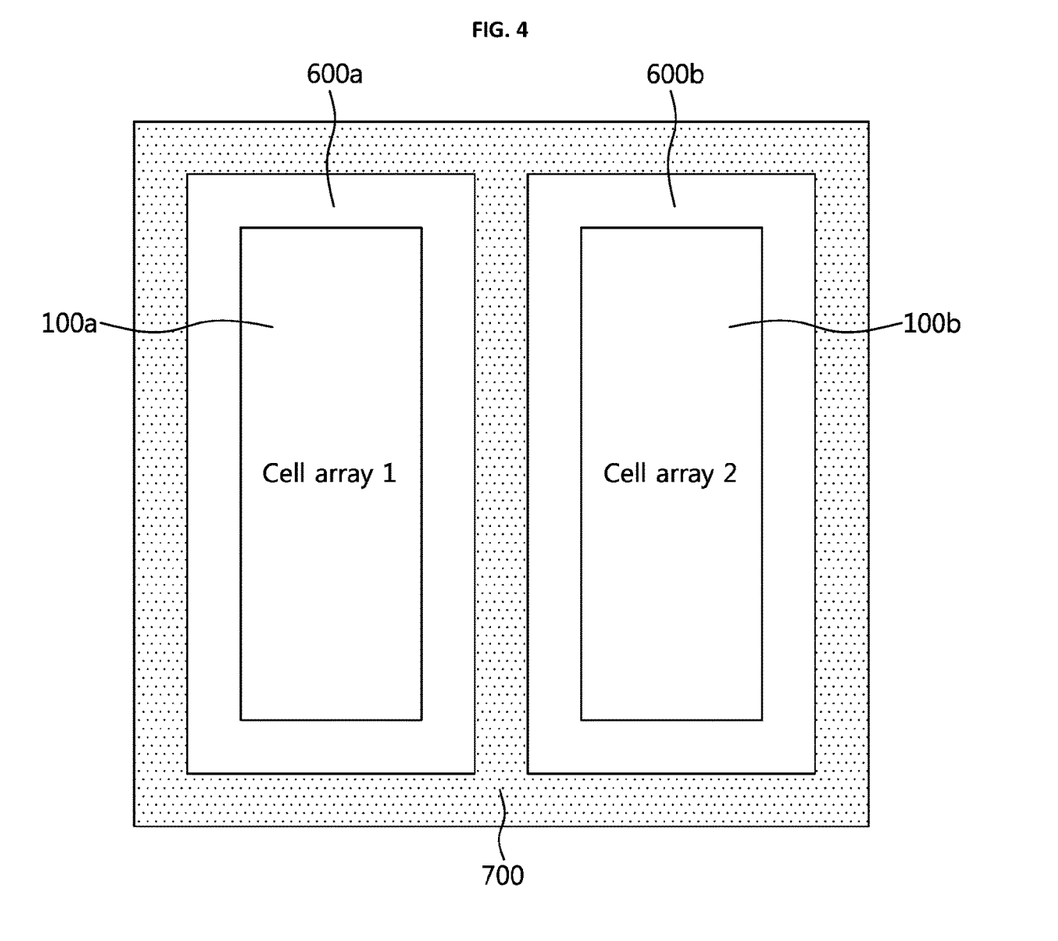
FIG. 4 illustrates a power ring of a non-volatile memory device in accordance with one or more embodiments of the disclosure.

FIG. 4 illustrates a power ring of a non-volatile memory device in accordance with one or more embodiments of the disclosure.

Referring to FIG. 4, the power ring or ring-type power line 700 may surround the first ground ring 600a and the second ground ring 600b. The power ring 700 may be also disposed between the first fuse cell array and the second fuse cell array. The power ring 700 may surround an outside of the first and second fuse cell arrays 100a and 100b. The power ring 700 may be also disposed between the first and second fuse cell arrays 100a and 100b. Therefore, the first and second fuse cell arrays 100a and 100b may be completely surrounded by the power ring 700. The ring-type power line 700 may be desired to uniformly supply power voltage.

Figure 5:
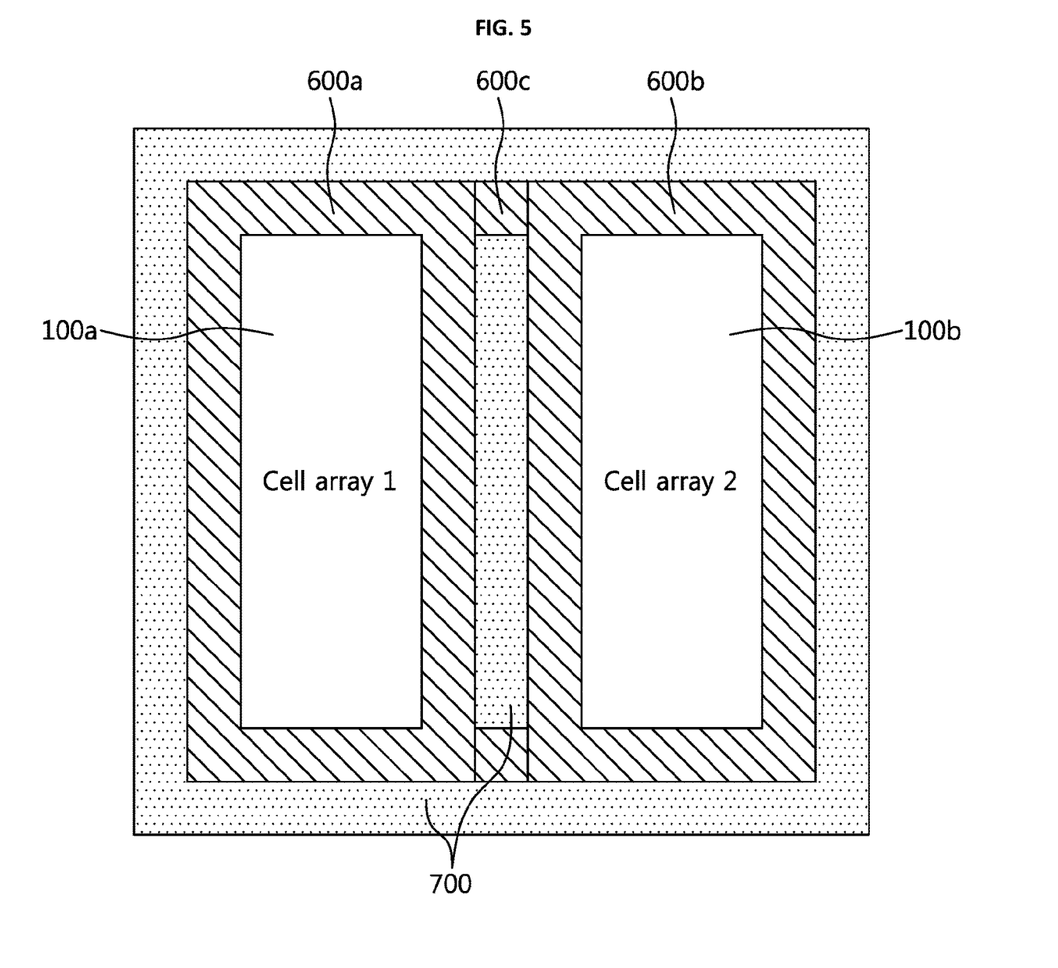
FIG. 5 illustrates a diagram combining a ground ring with a power ring of a non-volatile memory device in accordance with one or more embodiments of the disclosure.

FIG. 5 illustrates a diagram combining a ground ring with a power ring of a non-volatile memory device in accordance with one or more embodiments of the disclosure.

Referring to FIG. 5, the first and second fuse cell arrays 100a and 100b may be respectively surrounded by the ground ring 600. The power ring 700 may surround the ground ring 600. The ground ring 600 and the power ring 700 are provided to uniformly supply a ground voltage (VSS) and a power voltage (VDD), respectively. The ground ring 600 may be more close to the first and second fuse cell arrays 100a and 100b, rather than the power ring 700. The power ring 700 may be longer length than that of the ground ring 600. There may be an overlapped region between the ground ring 600 and the power ring 700. In one example, the third ground ring region 600c may be overlapped with the power ring 700. Therefore, the ground ring 600 and the power ring 700 may be disposed in a different plane. The ground ring 600 and the power ring 700 may refer to a metal wiring, and they may be formed by Al or Cu metal wiring. As mentioned earlier, the power ring region 700 may be disposed between the first and second fuse cell arrays 100a and 100b. The address decoder 200 may be also disposed between the first and second fuse cell arrays 100a and 100b. Therefore, when overlapping FIG. 2 and FIG. 5, the power ring region 700 may be overlapped with the address decoder 200. Additionally, the power ring region 700 may be overlapped with the control logic 500. The power ring region 700 may directly pass over the control logic 500.

Figure 6:
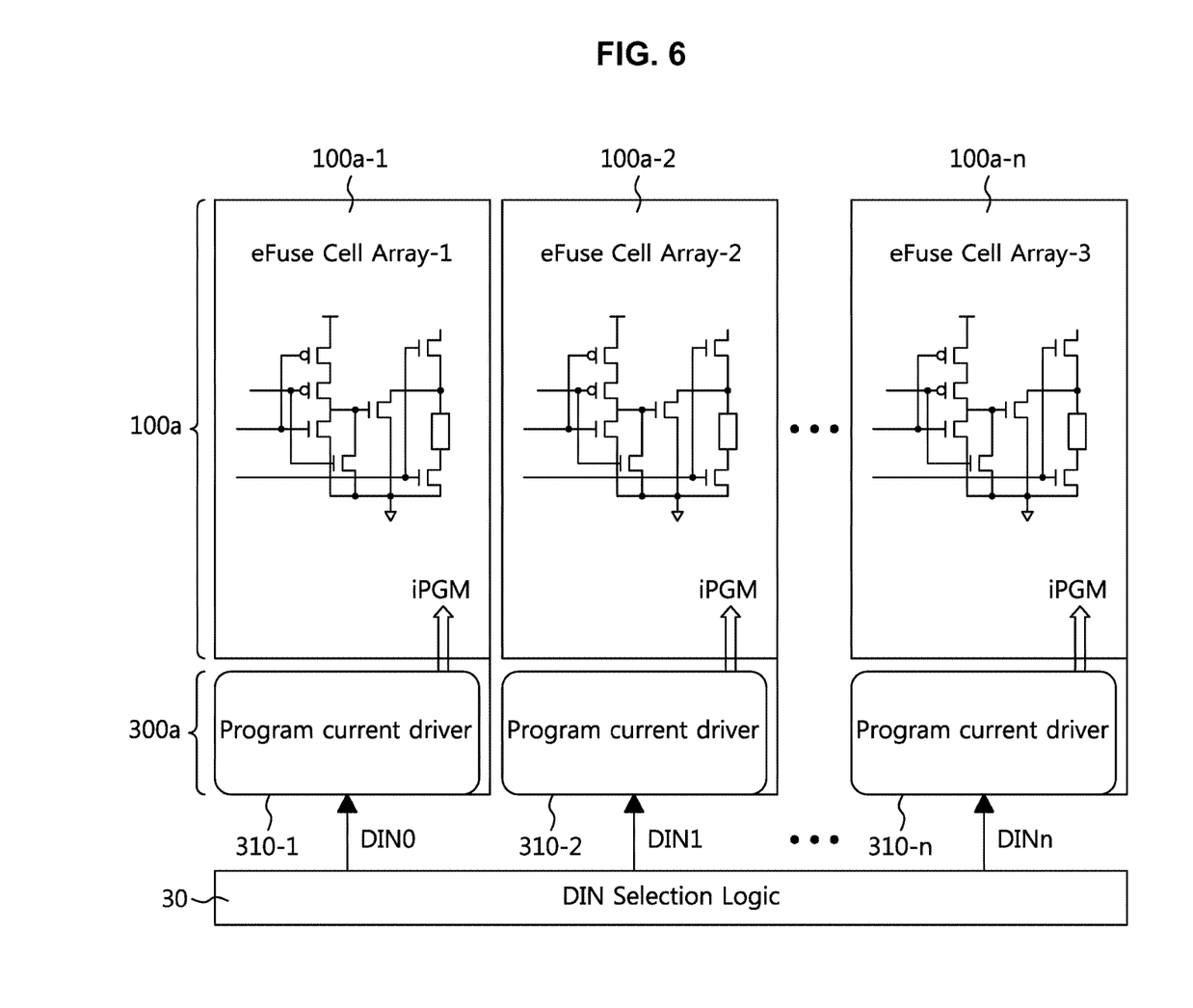
FIG. 6 illustrates an enlarged layout of a program current driver of a non-volatile memory device in accordance with one or more embodiments of the disclosure.

FIG. 6 illustrates an enlarged layout of a program current driver of a non-volatile memory device in accordance with one or more embodiments of the disclosure.

Referring to FIG. 6, a non-volatile memory device according to one or more embodiment of the disclosure may include a DIN selection logic 30, a program driver logic 300a having a plurality of program current drivers 310-1, 310-2. 310-n, and an eFuse cell array 100a. The eFuse cell array 100a may include at least n sub-eFuse cell array(s) 100a-1, 100-a2, 100a-n.

The DIN selection logic 30 may output a data input (DIN) signal. There are DIN0, DIN1, . . . . DINn as a data input (DIN) signal. The data input (DIN) signal may be supplied to each program current driver 310-1, 310-2 and 310-n. Each program current driver 310-1, 310-2 and 310-n may supply a program current (iPGM) to a unit cell disposed in the eFuse cell array 100a. Each sub-eFuse cell array 100a-1, 100-a2, 100a-n may receive the program current (iPGM).

A DIN selection logic 30 may be disposed inside the control logic 500. The DIN selection logic 30 may receive a DIN selection signal from the control logic 500. Through the DIN selection signal, it may be determined which signal among DIN0, DIN1, DINn becomes active. When one becomes active, a corresponding column may become active.

In FIG. 6, through the DIN selection logic 30, it may be possible to select some of sub-eFuse cell arrays and to simultaneously supply a program current. In one example, the first eFuse cell array 100a-1 and $n^{th}$ sub-eFuse cell array 100a-n may be programmed. A DIN0 node and DINn node may be active, and a DIN1 node may be inactive through the DIN selection logic 30. In this case, DIN0_ON, DIN1_OFF, and DINn_ON signals may be delivered to the first program current driver 310-1, the second program current driver 310-2, and $n^{th}$ program current driver 310-n, respectively. Then, the first program current driver 310-1 and $n^{th}$ program current driver 310-n may become active. However, the second program current driver 310-2 may be inactive.

The same program current (iPGM) may be simultaneously supplied to the first sub-eFuse cell array 100a-1 and $n^{th}$ sub-eFuse cell array 100a-n. However, since the second program current driver 310-2 is off, the program current may not be supplied to the second sub-eFuse cell array 100a-2.

Fuses disposed in the first sub-eFuse cell array 100a-1 and $n^{th}$ sub-eFuse cell array 100a-n may be simultaneously programmed. A current driver may supply the same amount of program current to each program branch. A program branch refers to a path to perform a program operation, that is, a transistor or inside nodes related to a program. The same amount of the program current (iPGM) may be supplied (arrow) to program a unit cell in a selected column when a column is selected by the control logic 500. One or more columns may be selected, and unit cells in all selected columns may be programmed simultaneously. It is possible because program current drivers 310-1, 310-2 and 310-3 may supply the program current equally to all unit cells. Through the DIN selection logic 30, DIN0, DIN1, . . . , DINn node may be active. In this case, the program current (iPGM) may be simultaneously supplied to eFuse cell array 100a. On the other hand, in a typical case, programming operation is performed one bit by one bit through a row decoding and column decoding.

Figure 7:
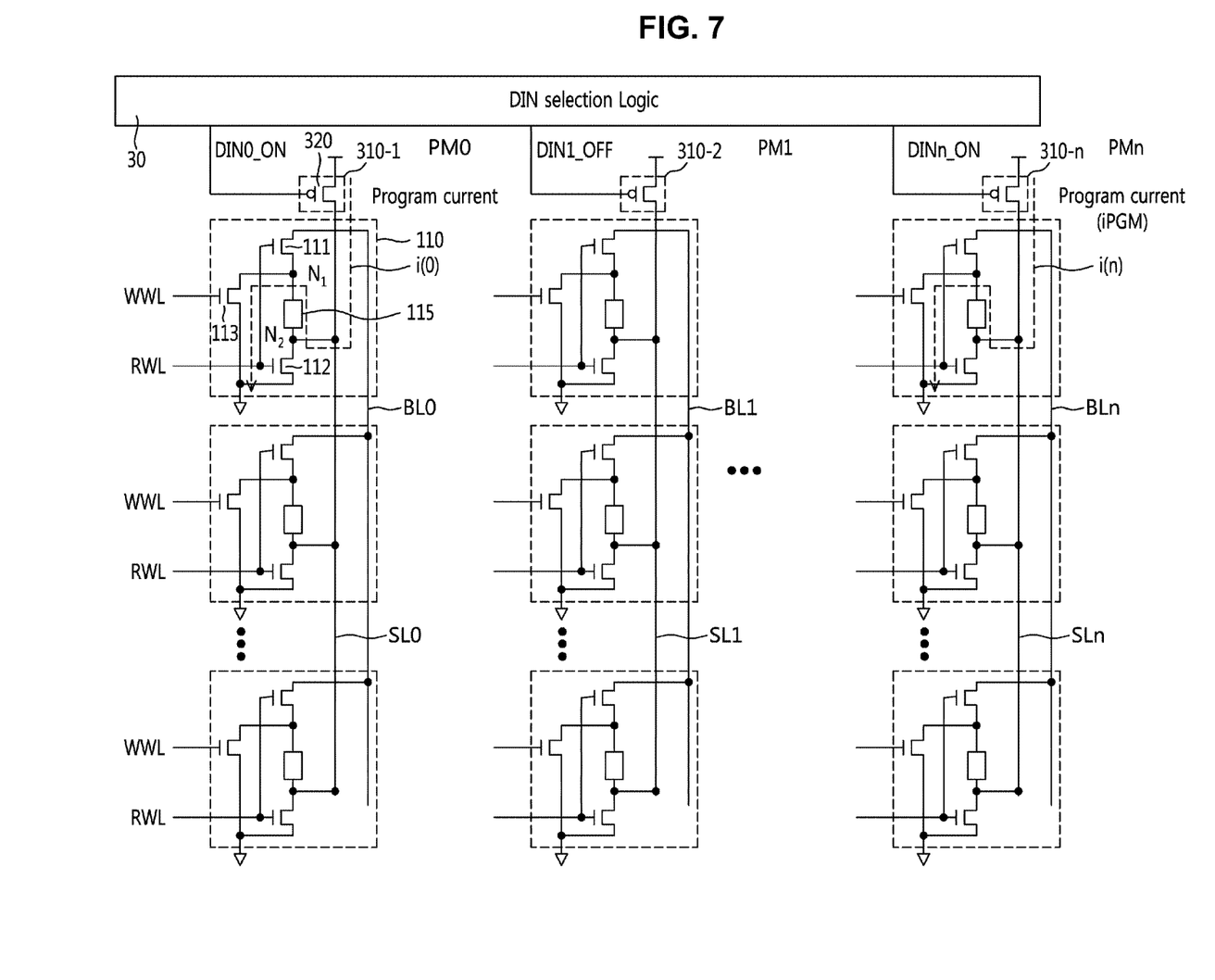
FIG. 7 illustrates a circuit block diagram to describe programming a plurality of unit cells simultaneously in a non-volatile memory device in accordance with one or more embodiments of the disclosure.

FIG. 7 illustrates a circuit block diagram to describe programming a plurality of unit cells simultaneously in a non-volatile memory device in accordance with one or more embodiments of the disclosure.

Referring to FIG. 7, a program branch is illustrated in a parallel programming eFuse memory 20 in accordance with one or more embodiment of the disclosure. A program branch may mean a program current path in the program operation. Program current drivers 310-1, 310-2 and 310-n may be turned on through the DIN selection logic 30. Additionally, through the program current drivers 310-1, 310-2 and 310-n, an eFuse cell 110 may be programmed by flowing the same amount of program current. Herein, a program current (iPGM) may be supplied through source lines SL0, SL1 and SLn connected to the program current drivers 310-1, 310-2 and 310-n. A 'low' signal may be supplied to DIN0 and DINn nodes through the DIN selection logic 30. Program current drivers PM0 and PMn may be simultaneously turn-on. Accordingly, program currents i(0) and i(n) may flow into the first eFuse cell and $n^{th}$ eFuse cell 110. A fuse 115 disposed in the selected cell 110 may be programmed. Program branches connected to the program current drivers PM0 and PMn may be simultaneously parallel programmed. On the other hand, a 'high' signal may be supplied to DIN1 node, so the program current driver PM1 is turn-off. Accordingly, a program current may not flow into the corresponding path, and a program operation (write operation) may be blocked.

Referring to FIG. 7, a unit cell 110 in the eFuse cell array may comprise to a first NMOS transistor 111, a second NMOS transistor 112, third NMOS transistor 113 and fuse 115. A Read Word Line (RWL) is connected to each of gate terminals of the first and second NMOS transistor 111 and 112. The fuse 115 may be disposed between the first and second NMOS transistors 111 and 112. Additionally, a source terminal of the first NMOS transistor 111 may be connected to a cathode of the fuse 115, and a drain terminal of the second NMOS transistor 112 may be connected to an anode of the fuse 115. The source terminal of the second NMOS transistor 112 may be grounded. Herein, the fuse 115 may be formed using a poly-silicon and silicide layer. Write Word Line (WWL) is connected to a gate terminal of the third NMOS transistor 113. A drain terminal of the third NMOS transistor 113 may be connected a first node N1 which is disposed between the first NMOS transistor 111 and the fuse 115. A source terminal of the third NMOS transistor 113 may be connected to grounded voltage. The third NMOS transistor 113 is an NMOS transistor.

The program current driver 310-1 is connected to a second node N2 disposed between the drain terminal of the second NMOS transistor 112 and the anode of the fuse 115. The program current driver 310-1 may include a PMOS transistor to supply a program current to the plurality of unit cells 110. A gate of the PMOS transistor 320 may receive a DIN selection signal from the DIN selection logic 30. A drain of the PMOS transistor 320 may be connected to the anode of the fuse 115. A programming operation may be performed by applying a high voltage to a selected fuse.

Referring to FIG. 7, during a program operation of a non-volatile memory device, the DIN selection logic 30 may provide a DIN_ON or DIN_OFF to the program current drivers 310-1, 310-2 or 310-n. The control logic 500 may select a unit cell to perform a program operation. Then, the program current driver 310-1 may simultaneously apply the same amount of program current to the selected columns through source lines SL0, SL1 and SLn. The third NMOS transistor 113 and the PMOS transistor 320 may be turned on, and the first and second NMOS transistor 111 and 112 may be turned off. A program current (arrow) flows through the PMOS transistor 320, the fuse 115 and the third NMOS transistor 113. The fuse 115 may be programmed. The programmed fuse 115 may have a high resistance over 3 kΩ.

In one example, there are three columns spaced apart from each other in FIG. 7, and it is assumed that the first and third columns will be programmed. The DIN selection logic 30 may provide DIN_ON signals to the first and third columns. Two PMOS switch transistors disposed in the first and third columns may be turned on. The same amount of program current may simultaneously flow through the first and third columns. The same amount of program current may flow through selected fuses disposed in the first and third columns, and the selected fuses are blowing and they are programmed. The same amount of parallel program current may simultaneously flow through the first and third columns.

On the other hand, the second column may receive DIN_OFF signal, so it belongs to an unselected column. Since the PMOS switch transistor disposed in the second column may be turned off, a program current may not flow into the second column. The fuse disposed in the second column may not be programmed. Accordingly, the selected columns may be simultaneously programmed by selecting several columns to be programmed and simultaneously supplying the same amount of program current to the selected columns. Through the disclosure, it may be possible to reduce a program time of an eFuse memory embedded in a product compared with a typical case. Therefore, a test cost is reduced, and competitiveness may be ensured. When performing a calculation based on ×16 parallel program, which is a standard of a test vehicle, a program time is reduced to 1/16.

Figure 8:
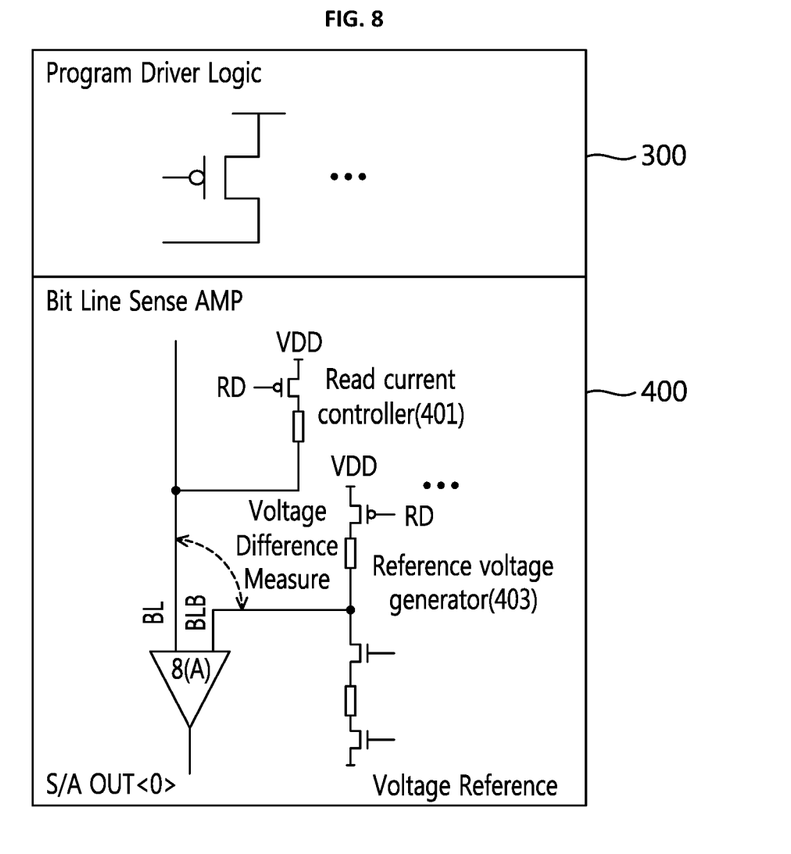
FIG. 8 illustrates an enlarged layout of a program current driver and a sense amplifier (AMP) of a non-volatile memory device in accordance with one or more embodiments of the disclosure.

FIG. 8 illustrates an enlarged layout of a program current driver and a sense AMP of a non-volatile memory device in accordance with one or more embodiments of the disclosure.

Referring to FIG. 8, one program driver logic 300 is illustrated, and the program driver logic 300 may be relatively smaller than a sense AMP 400. The reason why the sense AMP 400 is larger is that the sense AMP may include a read current controller 401 and a reference voltage generator 403. The read current controller 401 is configured to provide a read current to the selected e-fuse cell to produce a read voltage through the bit line BL. The reference voltage generator 403 is configured to provide a reference voltage to the sense AMP through the bit line bar BLB. The sense AMP 400 may produce a difference in voltage values between the read voltage and the reference voltage, such that it may be checked whether the selected unit cell is programmed or not from the difference in voltage values.

The read current controller 401 may comprise a switching device (PMOS transistor) and a resistor. The reference voltage generator 403 may comprise three switching devices and two resistors. The reference voltage generator 403 may distribute a read voltage by using a plurality of resistors connected in series and generate a reference voltage with the distributed voltage. Since many devices are desired, the sense AMP may be larger.

Figure 9:
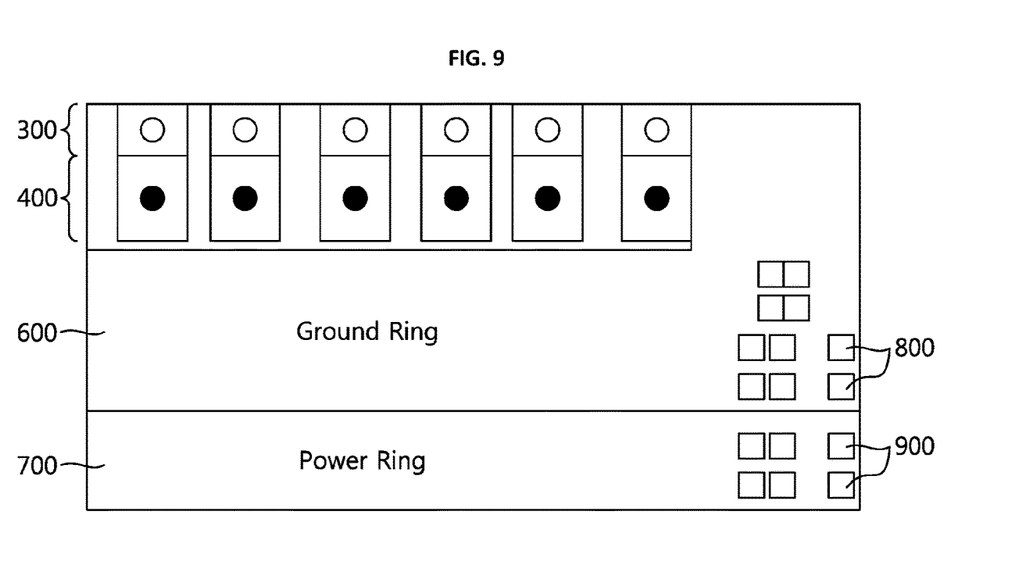
FIG. 9 illustrates an enlarged layout of a power ring, a ground ring, and a decoupling power capacitor of a non-volatile memory device in accordance with one or more embodiments of the disclosure.

FIG. 9 illustrates an enlarged layout of a power ring, a ground ring, and a decoupling power capacitor of a non-volatile memory device in accordance with one or more embodiments of the disclosure.

FIG. 9 illustrates an enlarged edge among edges of a chip in FIG. 2. As illustrated, the program driver logic 300 and the sense AMP 400 may be disposed on an upper side. There is a sense AMP 400 in each column. The ground ring region 600 and the power ring region 700 may be disposed below the sense AMP 400 in order. Additionally, a first decoupling power capacitor 800 and a second decoupling power capacitor 900 may be formed respectively in the ground ring region 600 and the power ring region 700. MOS capacitors are implemented for the first and second decoupling power capacitors 800 and 900. The ground ring region 600 and the power ring region 700 may overlap the first and second decoupling power capacitors 800 and 900.

When programming multiple unit cells simultaneously, a large current may be desired. In one example, 200 mA or more current may be desired. In this case, a momentary peak current may occur. An abnormal output voltage swing may happen due to a momentary peak current. The first and second decoupling power capacitors 800 and 900 may cut off the momentary peak current, resulting in blocking the abnormal output voltage swing. The first and second decoupling power capacitors 800 and 900 may block a power noise.

According to a non-volatile memory device in accordance with one or more embodiments of the disclosure, it may be possible to program unit cells of a fuse cell array simultaneously. Therefore, it may be possible to reduce a program time and a test time.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory device, comprising:
a first fuse cell array and a second fuse cell array, spaced from each other;
a ground ring region comprising a first ground ring region and a second ground ring region disposed to surround the first fuse cell array and the second fuse cell array, respectively;
a ground ring connection region configured to connect the first ground ring region and the second ground ring region;

a power ring region disposed to surround the first ground ring region and the second ground ring region, and disposed between the first fuse cell array and the second fuse cell array, the power ring region being configured to supply a power voltage to the first fuse cell array and the second fuse cell array;

a first decoupling power capacitor disposed in at least one of the first or second ground ring regions;

a second decoupling power capacitor disposed in the power ring region;

an address decoder, disposed between the first fuse cell array and the second fuse cell array and configured to supply a word line signal to each of the first fuse cell array and the second fuse cell array; and a sense amplifier disposed at a bottom of each fuse cell array, wherein the sense amplifier, the ground ring region, and the power ring region are disposed at the bottom of each fuse cell array in this order, wherein the ground ring region overlaps the first decoupling power capacitor, and the power ring region overlaps the second decoupling power capacitor, and wherein the first ground ring region, the second ground ring region, and the ground ring connection region supply a ground voltage to the first fuse cell array and the second fuse cell array.

2. The non-volatile memory device of claim 1, wherein the first fuse cell array and the second fuse cell array are symmetrically disposed about the address decoder, and
wherein an identical number of unit cells are disposed in the first fuse cell array and the second fuse cell array.

3. The non-volatile memory device of claim 1, further comprising:
a first program driver logic configured to supply a program current to the first fuse cell array;
a second program driver logic configured to supply the program current to the second fuse cell array;
a data input (DIN) selection logic configured to selectively operate the first program driver logic and the second program driver logic; and
a control logic comprising the DIN selection logic.

4. The non-volatile memory device of claim 3, wherein the first program driver logic and the second program driver logic comprise a plurality of program current drivers, and
wherein the first program driver logic and the second program driver logic are configured to simultaneously select the plurality of program current drivers based on a data input (DIN) signal generated in the DIN selection logic, and simultaneously supply the program current equally to the selected plurality of program current drivers.

5. The non-volatile memory device of claim 4, further comprising:
a plurality of unit cells in each of the first fuse cell array and the second fuse cell array,
wherein each of program current drivers comprises a PMOS transistor, and
wherein each of the unit cells comprises:
a first NMOS transistor and a second NMOS transistor;
a fuse disposed between the first NMOS transistor and the second NMOS transistor;
a first node disposed between the first NMOS transistor and the fuse;
a second node disposed between the second NMOS transistor and the fuse; and
a third NMOS transistor connected to the first node, and wherein the program current flows through the PMOS transistor, the second node, the fuse, the first node and the third NMOS transistor, and programs the fuse.

6. The non-volatile memory device of claim 1, wherein the first decoupling power capacitor and the second decoupling power capacitor are MOS capacitors.

7. The non-volatile memory device of claim 1, wherein the power ring region overlaps the address decoder.

8. The non-volatile memory device of claim 1, wherein the sense amplifier further comprises:
a first sense amplifier (AMP) and a second sense AMP configured to detect read data of a plurality of unit cells in each of the first fuse cell array and the second fuse cell array,
wherein each of the first sense AMP and the second sense AMP comprise a read current controller and a reference voltage generator configured to generate a reference voltage, and
wherein each of the first sense AMP and the second sense AMP compares a voltage at a fuse of each of the unit cells with the reference voltage and determines whether each of the unit cells is programmed.

9. A non-volatile memory device, comprising:
a first fuse cell array and a second fuse cell array, spaced apart from each other and disposed in symmetry;
an address decoder disposed between the first fuse cell array and the second fuse cell array;
a plurality of program current drivers configured to supply a program current to each of the first fuse cell array and the second fuse cell array;
a data input (DIN) selection logic configured to simultaneously operate the plurality of program current drivers;
a ground ring region disposed to surround the first and the second fuse cell arrays, the plurality of program current drivers, and the DIN selection logic;
a power ring region disposed to surround the ground region;
a first decoupling power capacitor region disposed in the ground ring region and a second decoupling power capacitor region disposed in the power ring region; and
a sense amplifier disposed at a bottom of each fuse cell array,
wherein the sense amplifier, the ground ring region, and the power ring region are disposed at the bottom of each fuse cell array in this order, and
wherein the ground ring region overlaps the first decoupling power capacitor, and the power ring region overlaps the second decoupling power capacitor.

10. The non-volatile memory device of claim 9, wherein the first fuse cell array and the second fuse cell array are symmetrical about the address decoder, and
wherein an identical number of unit cells are included in the first fuse cell array and the second fuse cell array.

11. The non-volatile memory device of claim 9, further comprising:
a plurality of unit cells in each of the first fuse cell array and the second fuse cell array,
wherein each of the program current drivers comprises a PMOS transistor, and
wherein each of the unit cells comprises:
a first NMOS transistor and a second NMOS transistor;
a fuse disposed between the first NMOS transistor and the second NMOS transistor;
a first node disposed between the first NMOS transistor and the fuse;

a second node disposed between the second NMOS transistor and the fuse; and a third NMOS transistor connected to the first node, and wherein the program current flows through the PMOS transistor, the second node, the fuse, the first node and the third NMOS transistor and programs the fuse.

12. The non-volatile memory device of claim 9, wherein the ground ring region comprises:

a first ground ring region disposed to surround the first fuse cell array;

a second ground ring region disposed to surround the second fuse cell array; and a ground ring connection region configured to connect the first ground ring region and the second ground ring region, and wherein the power ring region disposed to surround the first ground ring region and the second ground ring region.

13. The non-volatile memory device of claim 12, wherein the first ground ring region, the second ground ring region, and the ground ring connection region supply a ground voltage to each of the first fuse cell array and the second fuse cell array, and wherein the power ring region supplies a power voltage to each of the first fuse cell array and the second fuse cell array.

14. A non-volatile memory device, comprising:

an address decoder configured to connect to a power voltage and a ground voltage;

fuse cell arrays, symmetrically disposed about the address decoder and configured to connect to the address decoder, wherein the address decoder supplies a word line signal to the fuse cell arrays;

a control logic configured to control the address decoder;

program driver logics, disposed about the control logic, configured to supply a program current to the fuse cell arrays, connect to the control logic, and connect to the fuse cell arrays, respectively;

sense amplifiers disposed about the control logic, configured to detect whether the fuse cell arrays are programmed, connect to the control logic, and connect to the fuse cell arrays, respectively;

ground ring regions disposed to surround the fuse cell arrays, respectively, and supply the ground voltage to the fuse cell arrays;

a power ring region disposed to surround the ground ring regions and supply the power voltage;

a first decoupling power capacitor disposed in the ground ring regions; and a second decoupling power capacitor disposed in the power ring region, wherein the program driver logics are configured to simultaneously select a plurality of program current drivers based on a data input (DIN) signal generated in a DIN selection logic, and simultaneously supply the program current equally to the selected plurality of program current drivers.

15. The non-volatile memory device of claim 14, wherein the first decoupling power capacitor and the second decoupling power capacitor are MOS capacitors.

16. The non-volatile memory device of claim 14, wherein the power ring region is further disposed to overlap the address decoder.

17. The non-volatile memory device of claim 14, wherein each program current driver comprises a PMOS transistor configured to turn on in response to the DIN signal.

* * * * *